United States Patent [19]
Morohashi et al.

[11] Patent Number: 5,120,377
[45] Date of Patent: Jun. 9, 1992

[54] METHOD OF MANUFACTURING LAMINATED CERAMIC MATERIAL

[75] Inventors: Takashi Morohashi; Kazumasa Ohnishi, both of Nagaoka; Masato Furuhata, Mitsuke, all of Japan

[73] Assignee: Alps Electric Co., Ltd., Tokyo, Japan

[21] Appl. No.: 500,657

[22] Filed: Mar. 28, 1990

[30] Foreign Application Priority Data

Jul. 25, 1989 [JP] Japan .................................. 1-191915

[51] Int. Cl.⁵ ............................................. C04B 37/00
[52] U.S. Cl. ........................................ 156/89; 29/825; 29/829; 264/61
[58] Field of Search ................... 156/89, 90; 264/61, 264/104; 29/18.3, 825, 829

[56] References Cited

U.S. PATENT DOCUMENTS

| | | | |
|---|---|---|---|
| 4,631,099 | 12/1986 | Ebata et al. | 156/89 |
| 4,799,983 | 1/1989 | Desai | 156/89 |

FOREIGN PATENT DOCUMENTS

| | | |
|---|---|---|
| 58-196079 | 11/1983 | Japan . |
| 59-115579 | 7/1984 | Japan . |
| 63-17354 | 4/1988 | Japan . |

*Primary Examiner*—James Lowe
*Assistant Examiner*—Christopher A. Fiorilla
*Attorney, Agent, or Firm*—Guy W. Shoup; B. Noël Kivlin

[57] ABSTRACT

A method of manufacturing a laminated ceramic material having internal electrodes and the object thereof is to provide a method of manufacturing a laminated ceramic material using inexpensive metal material for internal electrodes. A method of manufacturing a laminated ceramic material includes printing or baking a metal member (foil) to ceramic layers thereby forming electrodes, stacking such a plurality of ceramic layers attached with electrodes and then integrating them by applying hot press bonding. The internal electrodes can be formed easily and, since various kinds of metals can be used as the metal for the electrodes, it is possible to provide an inexpensive laminated ceramic material at a reduced production cost.

4 Claims, 2 Drawing Sheets

1

METHOD OF MANUFACTURING LAMINATED CERAMIC MATERIAL

BACKGROUND OF THE INVENTION

1. Field of the Invention

The present invention concerns a method of manufacturing laminated ceramic material having internal electrodes.

2. Description of the Prior Art

Conventional laminated ceramic material has been manufactured, as typically shown by laminated capacitors or laminated piezoelectric actuators, by a method of printing a metal paste such as sivler or a silver-palladium alloy on a green ceramic sheet, applying press bonding to a plurality of such sheets in stack and, thereafter, decreasing and sintering them.

However, since the sintering temperature of ceramics is high (1300°–1800° C.), the conventional method involves a problem that silver is melted upon sintering because of low melting point of silver.

In view of the above, for preventing melting of silver, a silver-palladium alloy having a higher melting point than silver is prepared by using palladium, so that melting does not occur even at a sintering temperature of ceramics.

However, under the above-mentioned high temperature condition, since the silver-palladium alloy easily diffuses into the ceramics, there is a problem that the voltage withstand or insulation resistance of the ceramic material is reduced.

Further, although a paste of noble metal such as platinum is also used in view of its smaller reactivity with ceramics and high melting point, this results in a significant problem in that the cost is as high as silver.

OBJECT OF THE INVENTION

In view of the foregoing situations, an object of the present invention is to provide a method of manufacturing a laminated ceramic material by using inexpensive metal material for internal electrodes.

SUMMARY OF THE INVENTION

The foregoing object of the present invention can be attained by a first aspect of the present invention, which comprises printing or baking electrodes to a ceramic layer thereby forming a ceramic layer equipped with electrodes, stacking a plurality of such ceramic layers each equipped with electrodes, with a metal foil being inserted between each of the electrodes and then integrating them by applying hot press bonding.

A second aspect of the present invention resides in printing or baking electrodes to a metal foil thereby forming a composite member, inserting and stacking the composite member between each of a plurality of ceramic layers and then integrating them by applying hot press bonding.

A third aspect of the present invention resides in printing electrodes on a green ceramic sheet thereby forming a green ceramic sheet equipped with electrodes, stacking a plurality of such green ceramic sheets, with an metal foil being inserted between each of the electrodes, applying hot press bonding to form a laminate and then sintering the laminate.

A forth aspect of the present invention resides in printing or baking electrodes on a metal foil thereby forming a composite member, inserting the composite member between each of a plurality of green ceramic sheets into integration, applying hot press bonding to form a laminate and then sintering the laminate.

BRIEF DESCRIPTION OF THE ACCOMPANYING DRAWINGS

These and other objects, as well as advantageous features of the present invention will become apparent by reading the following description with reference the accompanying drawings, wherein FIGS. 1 and 2 are, respectively, cross sectional views for illustrating the first embodiment by the method according to the present invention;

PREFERRED EKMBODIMENTS OF THE INVENTION

The present invention will be described more in detail with reference to the drawings.

Figure 1:
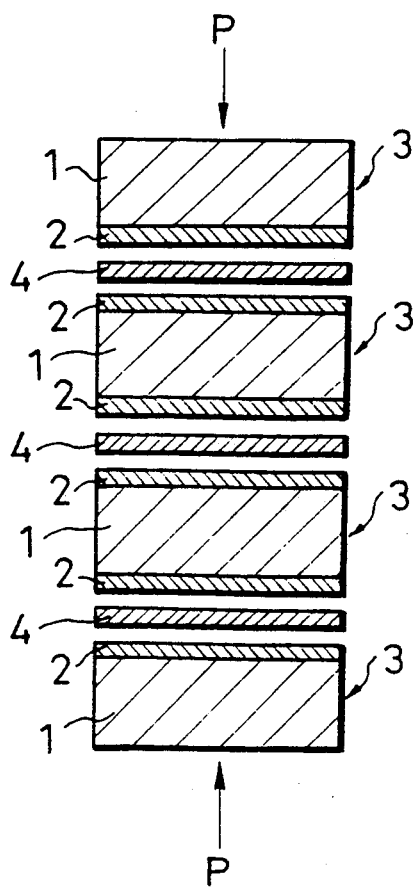
Figure 2:
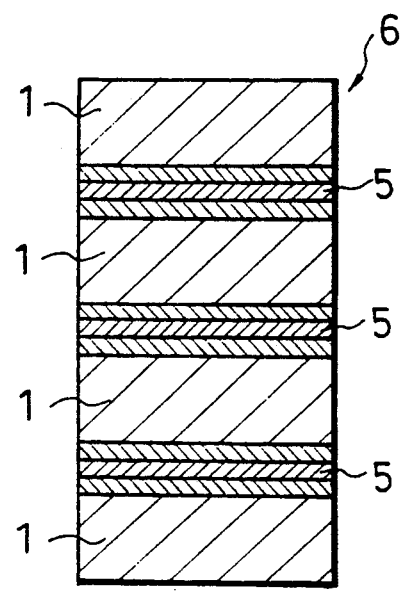

FIGS. 1 and 2 are, respectively, view illustrating the first example of the method according to the present invention. In this example, an electrode 2 is secured at the surface of ceramic layer 1 to form a cermic layer 3 equipped with electrodes.

For the ceramics used in the present invention, various kinds of ceramic materials can be selected and used depending on the application uses of the laminated ceramic material to be produced. For instance, various ceramic materials such as $BaTiO_2$ or composite perovskite type material are used in a case of manufacturing laminated capacitors and, piezoelectric ceramic materials such as PZT (lead zirconium titanate) are used in a case of manufacturing laminated actuators. Further, in this instance, plate-like ceramic materials formed by cutting sintered ceramic materials into desired size and grinding them are preferably used. As a method of manufacturing such ceramic material, doctor blade method, HIP (hot isostatic pressure method), etc. is used. For manufacturing the ceramic layer 1, for example, by the doctor blade method, a sheet-forming aids such as solvent, binder, dispersant, etc. are added to a ceramic powder to form a slip, the slip is molded into a thin sheet by a doctor blade device and, further, dried to prepare a green ceramic sheet. The green ceramic sheet is then sintered to prepare a ceramic plate. The ceramic plate is cut into a predetermined size and ground to prepare the ceramic layer 1.

For the electrode 2, electrode material having good adhesion with ceramics and satisfactory electroconductivity is used. Silver paste (silver-glass paste), etc. are particularly suitable materials.

The electrode material such as the silver-paste is secured by baking the silver paste on the surface of the ceramic layer 1 or by printing the silver paste and then fusing the same under heating.

After preparing the ceramic layer 3 equipped with electrodes, a plurality of such ceramic layers each equipped with electrodes are stacked, with a metal foil 4 being inserted between each of the electrodes to form an assembly. The metal foil 4 is made of material having satisfactory electrocoductivity and good adhesion with the silver paste, and silver, palladium silver-palladium alloy, etc. can be used preferably.

The assembly prepared by stacking the ceramic layers 3 each equipped with electrodes and the metal foils 4 is then integrated by hot press bonding. The assembly is hot press bonded, for example, by placing the assembly in a furnace, elevating a temperature while applying a pressure to the assembly along the vertical direction (direction shown by arrows P, P in FIG. 1), maintaining the temperature for a predetermined period of time after it reaches a predetermined temperature and then lowering the temperature. The conditions for the hot press bonding are properly determined depending on the material of the electrode 2 and the metal foil 4, etc. In the case of using a silver paste for the electrode 2 and a silver foil for the metal foil 4, about 700° to 950° C. of heating temperature and 1 to 200 min of retaining time are preferred.

With the operations described above, a laminated ceramic material 6 having internal electrodes 5 between a plurality of ceraminc layers 1 is prepared as shown in FIG. 2.

Figure 3:
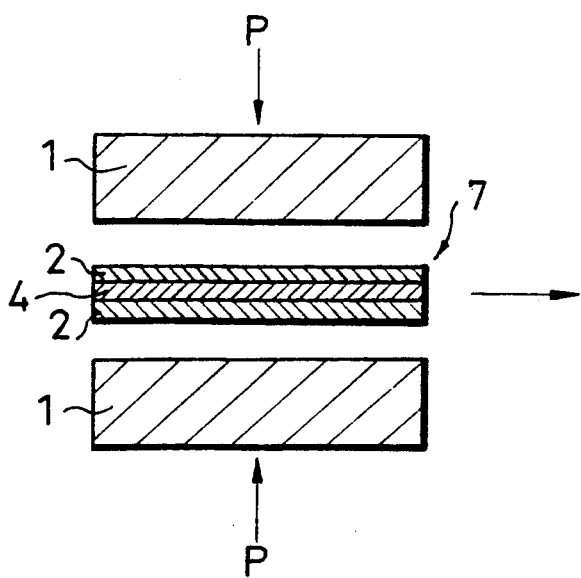
FIGS. 3 and 4 are, respectively, cross sectional views for illustrating the second example of the method according to the present invention.
Figure 4:
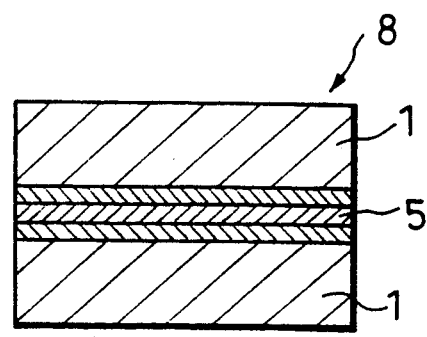

FIGS. 3 and 4 are views for explaining the second example of the method according to the present invention.

In this example, electrodes 2 such as made of a silver paste are at first printed or baked to both surfaces of the metal foil 4 to form a composite member 7.

Then, as shown in FIG. 3, a plurality of ceramic layers 1 are stacked with the composite member 7 being inserted between each of them. An assembly prepared by stacking a plurality of ceramic layers 1 and the composite member 7 is then integrated by hot press-bonding layers. Thus, a laminated ceramic material 8 in which internal electrodes 5 are formed between each of a plurality of ceramic layers 1 can be prepared.

Figure 5:
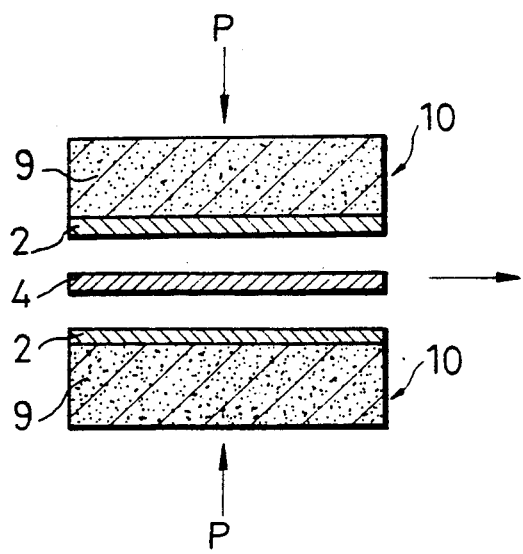
FIGS. 5 and 6 are, respectively, cross sectional views for illustrating the third example of the method according to the present invention.
Figure 6:
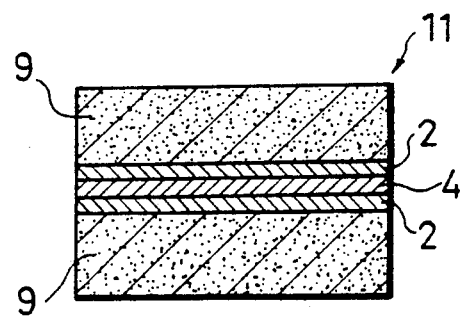

FIGS. 5 and 6 are views for explaining the third example of the method according to the present invention.

In this example, a non-sintered green ceramic sheet 9 is used instead of the ceramic layer 1, and an electrode 2 is printed on the surface of the green ceramic sheet 9 to form a green ceramic sheet 10 equipped with electrodes. For the material of the electrode used herein, a paste of silver-palladium alloy or a palladium paste is suitably used. Then, a plurality of green ceramic sheets 9 are stacked to each other with a metal foil 4 being inserted between each of the electrodes 2. As the metal foil 4, a silver-palladium alloy, palladium, etc. may be used suitably. Then, the metal foils 4 are fused to the electrodes 2 of a plurality of green ceramic sheets 10 by hot press bonding to form a laminate 11 in which the green ceramic sheets 9, the electrodes 2 and the metal foil 4 are integrated as shown in FIG. 6. Then, the laminate 11 is sintered. The sintering conditions are set to such temperature and time that the electrodes 2 and the metal foil 4 are not diffused into the ceramic layer 1. The conditions are determined while taking the sintering conditions for the ceramics material and the metal material into consideration. Preferred sintering conditions in a case of using the silver-palladium alloy as the electrode 2 and the metal foil 4 are about 1000° C. of sintering temperature and about one hour of sintering time.

By the sintering, a laminate ceramic material in which internal electrodes are formed between a plurality of ceramic material layers is manufactured in the same manner as the laminated ceramic materials 6, 8 shown in FIGS. 2 and 4.

Figure 7:
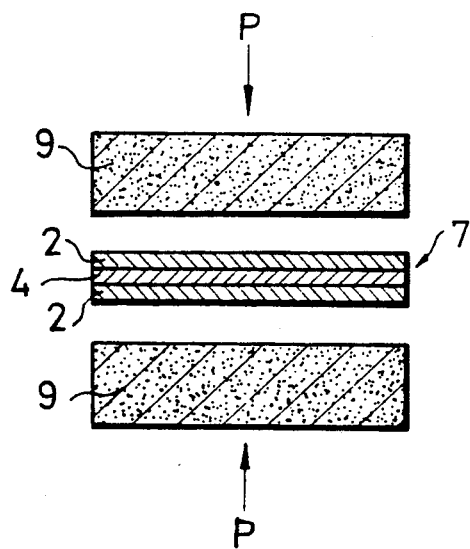
FIG. 7 is a cross sectional view for illustrating the fourth example of the method according to the present invention.

FIG. 7 is a view for explaining the fourth example of the method according to the present invention. In this example, electrodes 2 are at first printed or baked on both surfaces of a metal foil 4 to prepare a composite member 7. A plurality of green ceramic sheets 9 are then stacked with the composite member being inserted between each of them. Then, by applying hot press bonding to them, a laminate identical with the laminate 11 shown in FIG. 6 is obtained. The thus obtained laminate is next sintered in the same manner as in the third example to manufacture a laminated ceramic material.

EXAMPLE 1

Figure 8:
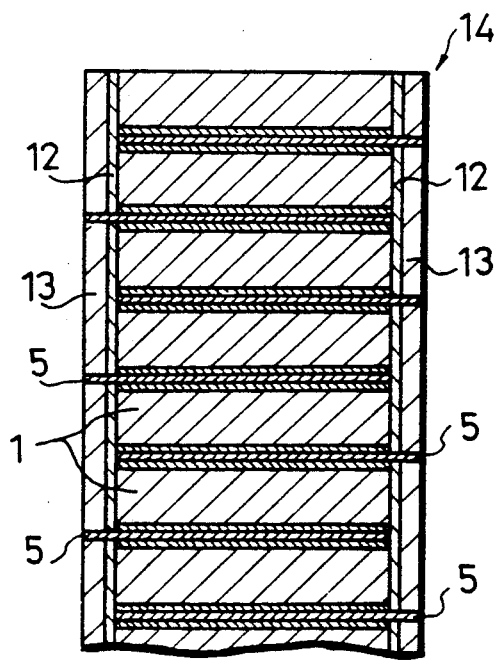
FIG. 8 is a cross sectional view illustrating an embodiment of a laminated actuator manufacture by the method according to the present invention.

A silver paste was baked to the surface of a PZT ceramic plate of 300 um thickness to prepare a ceramic layer equipped with electrodes. A sivler foil of 10 um thickness was then put between each of the ceramic layers equipped with electrodes and the ceramic layers equipped with the electrodes and the metal foils are stacked in a plurality of layers. In this case, the silver foils were inserted such that they are let out on every other foils to the outside of the ceramic layers. Then, the assembly was placed in a heating furnace while being seized at its uppermost and lowermost surface by a clipping jig, maintained at a temperature of 900° C. for 20 hours and then gradually cooled to obtain a laminated ceramic material. A thin insulation layer 12 made of a synthetic resin was then coated on both right and left sides of the resultant laminated ceramic material and an external common electrodes 13 made of metal is attached to each of the insulation layers 12 to manufacture a laminated piezoelectric actuator 14 as shown in FIG. 8.

As a result of examining the internal electrode portion in the resultant laminated piezoelectric actuator by using SEM, it was found that the metal diffused only slightly into the ceramic material. Further, the resultant laminated piezoelectric actuator showed a performance substantially identical with that of the laminated piezoelectric actuator using platinum as the inner electrode and manufactured by the conventional mehtod.

Further, a laminated piezoelectric actuator was manufactured in the same procedures except for using Ag-Cu silver braze foil (30 um thickness) instead of the silver foil and changing the conditions for hot press-bonding to 750° C. and 10 min. The resultant laminated piezoelectric actuator showed a performance as comparable with that using the silver foil.

EXAMPLE 2

The same ceramic layer and the silver foils as in Example 1 were used. At first, the silver paste was baked to both surfaces of the silver foil to form a composite member, two ceramic layers were stacked with a composite member being inserted therebetween and they were applied with hot press bonding in the same manner as in Example 1, to manufacture a laminated ceramic material.

As a result of examining the resultant laminated ceramic material, metal diffused only slightly into the ceramic material and the adhesion strength between each of the ceramic layers and each of the internal electrodes was also sufficient.

EXAMPLE 3

A green ceramic sheet was manufactured by using a Pb(Mg, W)$O_3$ series ceramic material powder by means of a doctor blade method. A silver-palladium alloy paste was printed on the surface of a green ceranic sheet of 300 um thickness to manufacture a green ceramic sheet equipped with an electrode. Then, two green ceramic sheets each equipped with an electrode were stacked, with a silver-palladium alloy foil of 10 um thickness being put there-between. They were placed in a heating furnace, being seized by a gripping jig and sintered at 1000° C. for 1 hour. By this sintering, the green ceramic sheets can be sintered, and electrodes made of silver-palladium alloy were baked between the sintered ceramic layers to obtain a laminated ceramic material.

As a result of examining the resultant laminated ceramic material, metal diffused only slightly into the ceramic material.

EXAMPLE 4

The same green ceramic sheet as in Example 3 was used. A composite member prepared by baking a paste of a silver-palladium alloy to both surfaces of a silver-palladium alloy foil each of 10 um thickness was put between two green ceramic sheets, and then sintered in the same procedures as in Example 3 to obtain a laiminated ceramic material.

As a result of examining the resultant laminated ceramic material, metal diffused only slightly into the ceramic material.

As has been described above according to the present invention, internal electrodes can be formed easily even for the ceramics of high sintering temperature and various kinds of metals can be used for the internal electrodes by applying heat treatment at a temperature corresponding to the melting point, and the production cost can be reduced by using inexpensive metals.

Furthermore, since heat treatment at high temperature is no more required, diffusion of electrode-forming element into ceramics can be suppressed thereby enabling to manufacture a laminated ceramic material of high performance.

Further, lead terminals for the inner electrodes can be constituted very easily by the insertion of metal foils so as to be led out to the out side of the laminated ceramic material.

What is claimed is:

1. A method of manufacturing a laminated ceramic material, which comprises printing or baking a first electrode to a first surface of a first sintered ceramic layer thereby forming a first ceramic layer equipped with said first electrode, printing or baking a second electrode to a first surface of a second sintered ceramic layer thereby forming a second ceramic layer equipped with said second electrode, stacking said first sintered ceramic layer equipped with said first electrode on said second sintered ceramic layer equipped with said second electrode with a metal foil being inserted between said first sintered ceramic layer and said second sintered ceramic layer such that a first surface of said metal foil faces said first electrode and such that a second surface of said metal foil faces said second electrode, and then bonding said metal foil to said first sintered ceramic layer equipped with said first electrode and to said second sintered ceramic layer equipped with said second electrode by applying hot press bonding.

2. A method of manufacturing a laminated ceramic material, which comprises printing or baking a first electrode to a first surface of a metal foil and a second electrode to a second surface of said metal foil thereby forming a ocmposite member, stacking a first sintered ceramic layer on a second sintered ceramic layer with said composite member being inserted between said first and second sintered ceramic layers and then bonding said composite member to said first and second sintered ceramic layers by applying hot press bonding 3. A method of manufacturing a laminated ceramic material, which comprises printing a first electrode to a first surface of a first green ceramic sheet thereby forming a first green ceramic sheet equipped with said first electrode, printing a second electrode to a first surface of a second green ceramic sheet thereby forming a second green ceramic sheet equipped with said second electrode, stacking said first green ceramic sheet equipped with said first electrode on said second green ceramic sheet equipped with said second electrode with a metal foil being inserted between said first green ceramic sheet and said second green ceramic sheet such that a first surface of said metal foil faces said first electrode and such that a second surface of said metal foil faces said second electrode, applying hot press bonding to said first and second green ceramic sheets to thereby form a laminate and then sintering said laminate.

4. A method of manufacturing a laminated ceramic material, which printing or baking a first electrode to a first surface of a metal foil and a second electrode to a second surface of said metal foil thereby forming a composite member, stacking a first green ceramic sheet on a second green ceramic sheet with said composite member being inserted between said first and second green ceramic sheets, applying hot press bonding to said first and second green ceramic sheets to thereby form a laminate and then sintering said laminate.

* * * * *